(12) United States Patent
Brown

(10) Patent No.: US 7,715,091 B2
(45) Date of Patent: May 11, 2010

(54) SPATIALLY-FED HIGH POWER AMPLIFIER WITH SHAPED REFLECTORS

(75) Inventor: Kenneth William Brown, Tucson, AZ (US)

(73) Assignee: Raytheon Company, Waltham, MA (US)

(*) Notice: Subject to any disclaimer, the term of this patent is extended or adjusted under 35 U.S.C. 154(b) by 17 days.

(21) Appl. No.: 12/194,319

(22) Filed: Aug. 19, 2008

(65) Prior Publication Data

US 2008/0315944 A1 Dec. 25, 2008

Related U.S. Application Data

(63) Continuation of application No. 11/230,863, filed on Sep. 20, 2005, now Pat. No. 7,443,573.

(51) Int. Cl.
*H01S 4/00* (2006.01)
*H01Q 19/10* (2006.01)
*H01Q 19/18* (2006.01)
*H01Q 3/28* (2006.01)

(52) U.S. Cl. ................... 359/333; 343/754
(58) Field of Classification Search ............... 359/333; 343/754
See application file for complete search history.

(56) References Cited

U.S. PATENT DOCUMENTS

| | | | | |
|---|---|---|---|---|
| 4,689,631 A * | 8/1987 | Gans et al. | ............... | 343/781 R |
| 4,905,014 A * | 2/1990 | Gonzalez et al. | ............ | 343/909 |
| 4,924,234 A * | 5/1990 | Thompson | .................. | 342/369 |
| 5,091,730 A * | 2/1992 | Cardiasmenos et al. | ..... | 342/153 |
| 5,392,152 A | 2/1995 | Higgins et al. | | |
| 5,504,493 A * | 4/1996 | Hirshfield | .................... | 342/372 |
| 5,945,941 A * | 8/1999 | Rich et al. | .................... | 342/157 |
| 6,396,449 B1 * | 5/2002 | Osterhues et al. | ........... | 343/754 |
| 6,538,793 B2 * | 3/2003 | Rosenberg et al. | .......... | 359/276 |
| 6,542,118 B2 * | 4/2003 | Lalezari et al. | ............. | 342/368 |
| 6,744,411 B1 * | 6/2004 | Osterhues et al. | ........... | 343/754 |
| 6,765,535 B1 | 7/2004 | Brown et al. | | |
| 6,859,183 B2 | 2/2005 | Carter et al. | | |
| 6,967,627 B2 | 11/2005 | Bhattacharyya et al. | | |

(Continued)

FOREIGN PATENT DOCUMENTS

WO WO-8606550 A1 11/1986

OTHER PUBLICATIONS

"U.S. Appl. No. 11/230,863, Response filed Apr. 24, 2008 to Final Office Action mailed Jan. 25, 2008", 16 pgs.

(Continued)

*Primary Examiner*—Eric Bolda
(74) *Attorney, Agent, or Firm*—Schwegman, Lundberg & Woessner, P.A.; Gregory J. Gorrie

(57) ABSTRACT

A spatially-fed high-power amplifier comprises one or more shaped reflectors to reflect an initial wavefront, and an active array amplifier to amplify the reflected wavefront to generate a high-power planar wavefront. The shaped reflectors provide the reflected wavefront with substantially uniform amplitude when incident on the active array amplifier. The initial wavefront may be a substantially spherical wavefront, and the shaped reflectors may compensate for any amplitude taper of the initial wavefront to provide the reflected wavefront with substantially uniform amplitude components for incident on the active array amplifier. In some embodiments, the shaped reflectors may also contour the illumination to fit the shape of the active array amplifier to help minimize spillover.

11 Claims, 9 Drawing Sheets

U.S. PATENT DOCUMENTS

| | | | |
|---|---|---|---|
| 6,985,120 | B2 | 1/2006 | Lewry et al. |
| 7,034,751 | B2 | 4/2006 | Brown et al. |
| 7,443,573 | B2 | 10/2008 | Brown |
| 2001/0050592 | A1* | 12/2001 | Wright et al. .................. 330/2 |
| 2002/0018282 | A1* | 2/2002 | Rosenberg et al. .......... 359/276 |
| 2004/0100343 | A1* | 5/2004 | Tsu et al. ...................... 335/78 |

OTHER PUBLICATIONS

"U.S. Appl. No. 11/230,863 Response filed May 27, 2008 to Advisory Action mailed May 14, 2008", 5 pgs.

"U.S. Appl. No. 11/230,863 Notice of Allowance mailed Jun. 19, 2008", 6 pgs.

"U.S. Appl. No. 11/230,863, Final Office Action Mailed Jan. 25, 2008", 10 pgs.

"Non-Final Office Action mailed Jun. 22, 2007in U.S. Appl. No. 11/230,863", Oarn, 12 pgs.

Delisio, M. P, et al., "Quasi-Optical and Spatial Power Combining", *IEEE Transactions on Microwave Theory and Techniques, IEEE Service center*, Piscataway, NJ, US, 50(3), XP011038636, (Mar. 2002), 929-936 pgs.

Von Hoerner, S., "Minimum—Noise Maximum-Gain Telescopes and Relaxation Method for Shaped Asymmetriic Surfaces", *IEEE Transactions on Antennas and Propagation*, AP-26(3), XP002412593, (May 1978), 464-471 pgs.

\* cited by examiner

SPATIALLY-FED HIGH POWER AMPLIFIER WITH SHAPED REFLECTORS

CROSS REFERENCE TO RELATED APPLICATIONS

This application is a Continuation of U.S. application Ser. No. 11/230,863, filed Sep. 20, 2005 now U.S. Pat No. 7,443,573, the contents of which are incorporated herein by reference in its entirety.

TECHNICAL FIELD

Embodiments of the present invention pertain to high-power amplification of microwave energy.

BACKGROUND

Solid state generation of high-power radio frequency (RF) energy, particularly at high-microwave and millimeter-wave frequencies, is limited by the power output of individual transistors. For example, at W-band frequencies, currently available high-power transistors only generate 50 to 100 milliwatts primarily because the transistors must be relatively small in size in order to have a useful gain. Due to this size limitation, the output power of thousands of transistors must be combined to generate high-power levels of greater than 100 watts, for example. Conventional power-combining techniques using waveguide or microstrip power combiners have substantial loss at W-band frequencies and are ineffective. This is because as the output of more transistors is combined, the distance between the transistors increases and the line lengths of the power combiners increase accordingly. This increases the insertion loss of the combiner and the phase match error between each leg of the combiner.

Thus, there are general needs for improved high-power RF amplifiers, particularly millimeter-wave and W-band high-power amplifiers.

SUMMARY

A spatially-fed high-power amplifier comprises one or more shaped reflectors to reflect an initial wavefront, and an active array amplifier to amplify the reflected wavefront to generate a high-power planar wavefront. The shaped reflectors provide the reflected wavefront with substantially uniform amplitude when incident on the active array amplifier. In some embodiments, the shaped reflectors may also contour the illumination to fit the shape of the active array amplifier to help minimize spillover. The initial wavefront may be a substantially spherical wavefront, and the shaped reflectors may compensate for any amplitude taper of the initial wavefront to provide the reflected wavefront with substantially uniform amplitude components for incident on the active array amplifier.

In some embodiments, the shaped reflectors comprise a section of a modified paraboloid surface, a section of a modified hyperboloid surface, or a section of a modified ellipsoid surface. The surfaces of the shaped reflectors may be represented by polynomials having coefficients selected to provide the reflected wavefront incident on the active array amplifier substantially uniform in amplitude and contoured to fit the shape of the active array amplifier. The coefficients of the polynomials may be iteratively adjusted until a simulated wavefront incident on the active array is substantially uniform in amplitude. The resulting coefficients may be used to generate the shapes of the reflective surfaces.

In some embodiments, the reflective surfaces comprise three-dimensional (3D) plastic surfaces having RF reflective coating disposed thereon. The 3D plastic surfaces may be formed by a stereolithography process.

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. Embodiments of the invention set forth in the claims encompass all available equivalents of those claims. Embodiments of the invention may be referred to, individually or collectively, herein by the term "invention" merely for convenience and without intending to limit the scope of this application to any single invention or inventive concept if more than one is in fact disclosed.

The present invention provides high-power amplifiers using spatial power combining techniques which essentially use the air or free space to illuminate an array of power amplifier elements. In this way, the insertion loss of this combining technique is about constant with respect to the number of transistors. In some embodiments, the present invention provides a spatially-fed high-power amplifier that may be part of a high-power microwave transmitter suitable for use in a communication system. In other embodiments, the present invention provides a spatially-fed high-power amplifier that may be suitable for use in a directed energy system, although the scope of the invention is not limited in this respect.

Figure 1A:
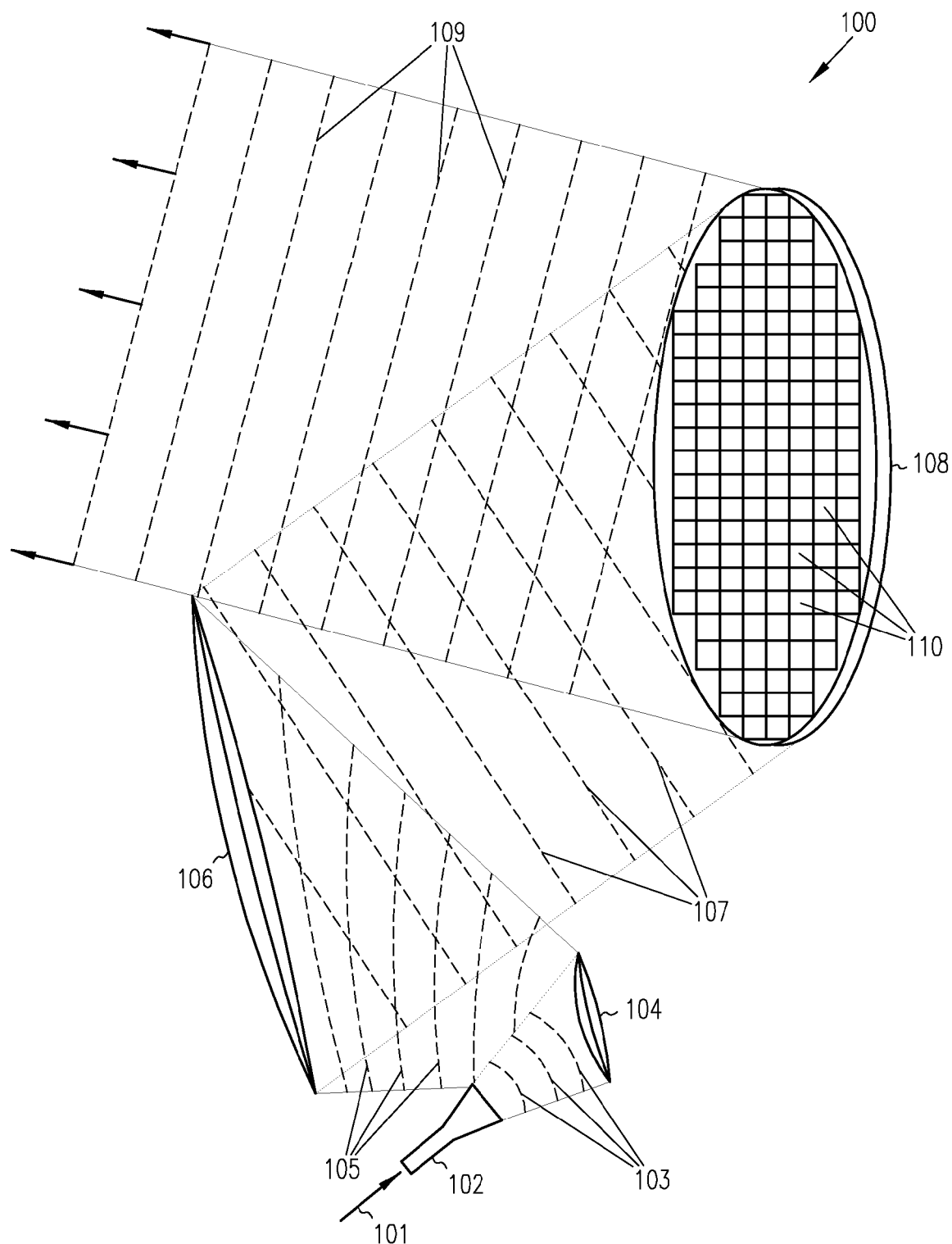
FIG. 1A illustrates a spatially-fed high-power amplifier for generating a planar output wave in accordance with some embodiments of the present invention.

FIG. 1A illustrates a spatially-fed high-power amplifier for generating a planar output wave in accordance with some embodiments of the present invention. Spatially-fed high-power amplifier 100 comprises feed horn 102 to generate initial wavefront 103 from a low-power radio-frequency (RF) input signal 101. Spatially-fed high-power amplifier 100 also comprises reflectors 104 and 106 having RF reflective surfaces to reflect initial wavefront 103 and generate reflected wavefront 107. Spatially-fed high-power amplifier 100 also comprises active array amplifier 108 to amplify reflected wavefront 107 to generate a high-power planar wavefront 109. Reflective surfaces of RF reflectors 104 and 106 are selected so that reflected wavefront 107 is substantially uniform in amplitude when incident on active array amplifier 108. This is described in more detail below. In some embodiments, reflected wavefront 107 may be substantially uniform in amplitude and substantially coherent in phase, although the scope of the invention is not limited in this respect. In some embodiments, reflected wavefront 107 may also be substantially contoured to fit the shape of active array amplifier 108, although the scope of the invention is not limited in this respect.

The spatially-fed high-power amplifiers of embodiments of the present invention are suitable for use with almost any RF frequency including microwave frequencies and millimeter-wave frequencies, and particularly W-band millimeter-wave frequencies, although the scope of the invention is not limited in this respect.

In some embodiments, high-power planar wavefront 109 may be a collimated wavefront (i.e., in a column), while in other embodiments, high-power planar wavefront 109 may be a converging or diverging wavefront.

In some embodiments, active array amplifier 108 may comprise a plurality of substantially identical amplifier cells 110. Each amplifier cell 110 may have a receive antenna to receive reflected wavefront 107, a power amplifier to amplify RF signals received through the receive antenna, and a transmit antenna to transmit the amplified RF signals provided by the power amplifier. The amplified RF signals transmitted by the plurality of amplifier cells 110 may comprise output wavefront 109. Initial wavefront 103 may comprise a substantially spherical wavefront with tapered amplitude components (i.e., a tapered illumination). In some embodiments, feed horn 102 may be a horn antenna and low-power RF input signal 101 may be provided in a waveguide structure, although the scope of the invention is not limited in this respect.

In some embodiments, the reflective surfaces of RF reflectors 104 and 106 may be selected to compensate for the amplitude taper of initial wavefront 103 and to provide reflected wavefront 107 with substantially uniform amplitude components and coherent phase components for incident on active array amplifier 108. In some embodiments, RF reflective surfaces of RF reflectors 104 and 106 may be represented by polynomials or other mathematical functions having coefficients selected to provide a wavefront incident on the active array that is substantially uniform in amplitude and substantially coherent in phase. In some embodiments, the surfaces are fabricated in accordance with the polynomials. These processes are described in more detail below.

In some embodiments, RF reflectors 104 and 106 may comprise a section of a modified paraboloid surface, a section of a modified hyperboloid surface and/or a section of a modified ellipsoid surface. In some embodiments, reflector 104 comprises a section of a modified paraboloid surface to generate wavefront 105, and reflector 106 comprises a section of a modified hyperboloid surface to generate wavefront 107. In some embodiments, reflector 104 may be a sub-reflector and reflector 106 may be a main reflector. Although many embodiments of the present invention are illustrated and described with two reflectors, the scope of the invention is not limited in this respect. Some embodiments of the present invention may use as few as one RF reflector, while other embodiments may use three or more RF reflectors.

In some embodiments, the RF reflective surfaces of RF reflectors 104 and 106 may comprise a three-dimensional (3D) plastic layer with a thin RF reflective (e.g., metallic) coating disposed thereon. In these embodiments, the 3D plastic layer may be formed by a stereolithography process described in more detail below.

Figure 2:
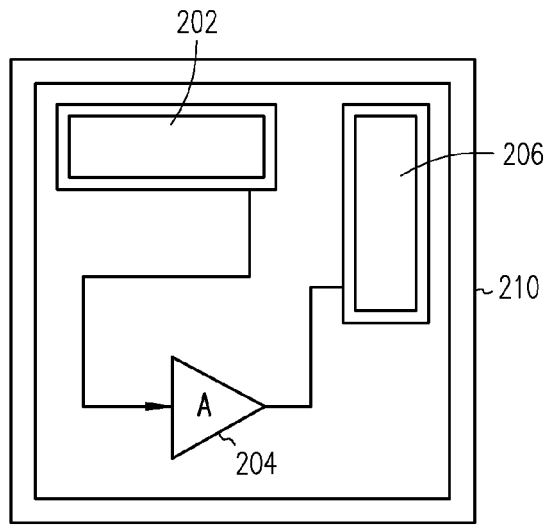
FIG. 2 illustrates an amplifier cell of an array amplifier in accordance with some embodiments of the present invention.

FIG. 2 illustrates an amplifier cell of an array amplifier in accordance with some embodiments of the present invention. Amplifier cell 210 may be suitable for use as one cell 110 (FIG. 1A) of array amplifier 108 (FIG. 1A), although other configurations are also suitable. Amplifier cells 210 may have substantially uniform gain and phase characteristics. In some embodiments, amplifier cells 210 may be individual semiconductor die while in other embodiments, the plurality of amplifier cells 210 may comprise a single semiconductor die.

In some embodiments, each amplifier cell may include receive antenna 202 to receive an incident wavefront, power amplifier 204 to amplify RF signals received through receive antenna 202, and transmit antenna 206 to transmit the amplified RF signals provided by power amplifier 204. In some embodiments, the amplified RF signals transmitted by the plurality of amplifier cells may comprise a planar output collimated wavefront.

In some embodiments, such as those illustrated in FIG. 1A, active array amplifier 108 (FIG. 1A) may be an active reflect array amplifier having both receive antennas 202 and transmit antennas 206 on a same side of a planar surface to generate the planar output wavefront 109 (FIG. 1A) in a reflected direction. In these embodiments, output planar wavefront 109 (FIG. 1A) may be viewed as a reflected high-power wavefront resulting from incident wavefront 107 (FIG. 1A).

In other embodiments, such as those illustrated in FIG. 3 described below, the active array amplifier may be an active lens array amplifier having receive antennas 202 on a first side of the active array amplifier to receive the reflected wavefront from the RF reflective surfaces, and having transmit antennas 206 on a second opposite side of the active array amplifier to generate a planar output wavefront in a through direction.

In accordance with some embodiments, reflected wavefront 107 (FIG. 1A) may be a uniform plane-wave with a power density level that will saturate most or all of cells 210 (FIG. 2) in the array for efficient utilization of the array amplifier.

In some other embodiments, referred to as anti-taper embodiments, amplifier cells 210 (FIG. 2) may have their gain set to offset the tapered amplitude components of initial wavefront 103 (FIG. 1A) so that array amplifier 108 (FIG. 1A) generates the substantially uniform amplitude components and/or uniform phase components of output wavefront 109 (FIG. 1A). In these embodiments, reflectors 104 and 106 do not necessarily have to have their surfaces modified as described herein, although the scope of the invention is not limited in this respect.

In these embodiments, each amplifier cell 110 (FIG. 1A) may have its gain set individually to cumulatively offset the tapered amplitude components of non-planar input wavefront 103 (FIG. 1A) to generate the substantially uniform amplitude components of planar output wavefront 109 (FIG. 1A). In these embodiments, an automatic gain control (AGC) process may be implemented by array amplifier 108 (FIG. 1A) to individually control the gain of each amplifier cell 110 (FIG. 1A) so that each unit cell may operate in at or near saturation, efficiently utilizing the output power capability of the array amplifier.

Although embodiments of the present invention are described as using reflective surfaces, the scope of the invention is not limited in this respect. In other embodiments, instead of one or more of reflective surfaces, RF lenses may be used. In these embodiments, the RF lenses may be similarly selected and generated to generate incident planar waves on an amplifier array. In some other embodiments, a combination of shaped RF reflective surfaces and shaped lenses may be used.

In some embodiments, the present invention provides an amplifier with one or more shaped RF lenses to change amplitude and/or phase characteristics of initial wavefront 103 (FIG. 1A) and generate substantially uniform amplitude wavefront 107 (FIG. 1A). In these embodiments, the shaped lenses may compensate for an amplitude taper of initial wavefront 103 (FIG. 1A) to provide wavefront 107 (FIG. 1A) with substantially uniform amplitude components for incident on active array amplifier 108 (FIG. 1A). In these embodiments, the shaped lenses may also be represented by polynomials having coefficients selected to provide a wavefront incident on the active array amplifier with substantially uniform amplitude components.

Figure 1B:
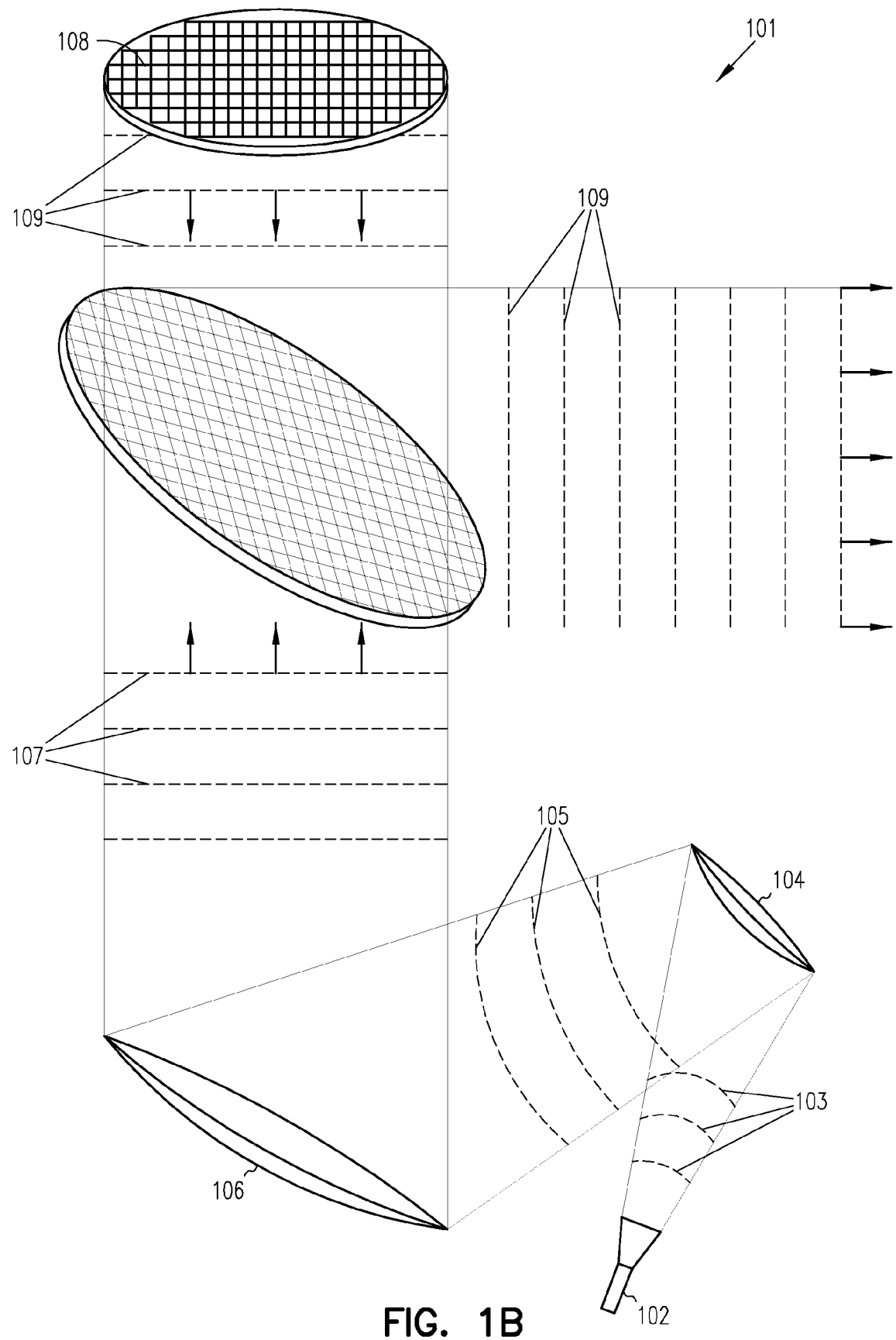
FIG. 1B illustrates a spatially-fed high-power amplifier for generating a planar output wave in accordance with some other embodiments of the present invention.

FIG. 1B illustrates a spatially-fed high-power amplifier for generating a planar output wave in accordance with some other embodiments of the present invention. Spatially-fed power amplifier 101 (FIG. 1B) is similar to spatially-fed power amplifier 100 (FIG. 1A), however spatially-fed power amplifier 101 (FIG. 1B) includes polarizer grid 112 positioned between reflector 106 and active array amplifier 108. Polarizer grid 112 may pass wavefronts of one polarization and may reflect wavefronts of another polarization. In some embodiments, wavefront 107 may, for example, be horizontally polarized. In these embodiments, polarizer grid 112 may pass horizontally polarized wavefront 107, array amplifier 108 may receive the horizontally polarized waves and may transmit vertically polarized waves (i.e., may rotate the polarization). Polarizer grid 112 may reflect the vertically polarized waves as wavefront 109. These embodiments of the present invention allow active array amplifier 108 to receive incident wavefront 107 at a substantially normal angle to it surface. In these embodiments, receive antennas 202 (FIG. 2) and transmit antennas 206 (FIG. 2) of each cell 210 (FIG. 2) of active array amplifier 108 may have orthogonal polarizations. The terms horizontal and vertical are used herein as examples of orthogonal polarizations and may be interchanged. Embodiments of the present invention may also be suitable for use with other orthogonal polarizations.

Figure 3:
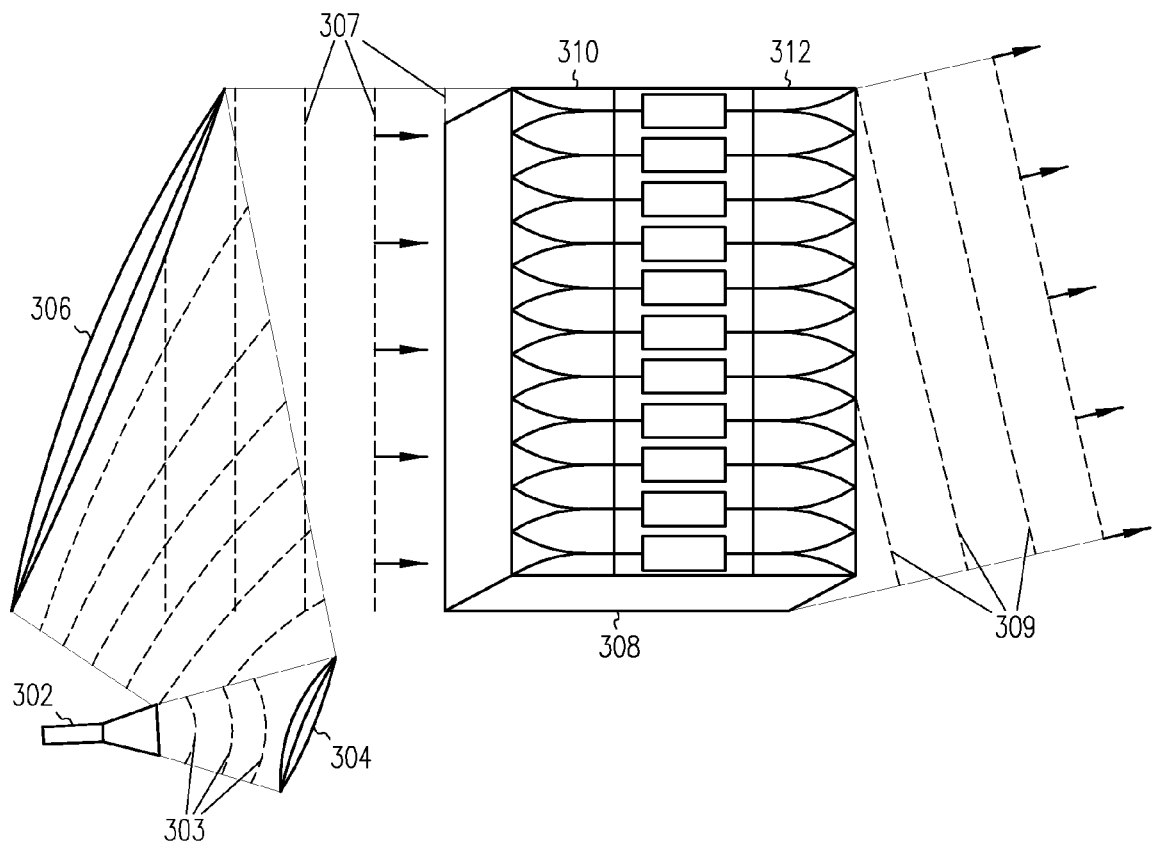
FIG. 3 illustrates a spatially-fed high-power amplifier for generating a planar output wave in accordance with some other embodiments of the present invention.

FIG. 3 illustrates a spatially-fed high-power amplifier for generating a planar output wave in accordance with some other embodiments of the present invention. Spatially-fed high-power amplifier 300 comprises feed horn 302 to generate initial wavefront 303 from low-power RF input signal 301, reflectors 304 and 306 having RF reflective surfaces to reflect initial wavefront 303 and generate reflected wavefront 307, and active lens array amplifier 308 to amplify reflected wavefront 307 to generate high-power planar wavefront 309. Reflective surfaces of the RF reflectors 304 and 306 may selected so that reflected wavefront 307 is substantially uniform in amplitude when incident on active array amplifier 308.

In some embodiments, active lens array amplifier 308 may have receive antennas, such as receive antennas 202 (FIG. 2), on first side 310 of active array amplifier 308 to receive reflected wavefront 307 from RF reflective surface 306. In these embodiments, active lens array amplifier 308 may have transmit antennas, such as transmit antennas 206 (FIG. 2), on second opposite side 312 of active array amplifier 308 to generate planar output wavefront 309 in the through direction as illustrated.

Figure 5:
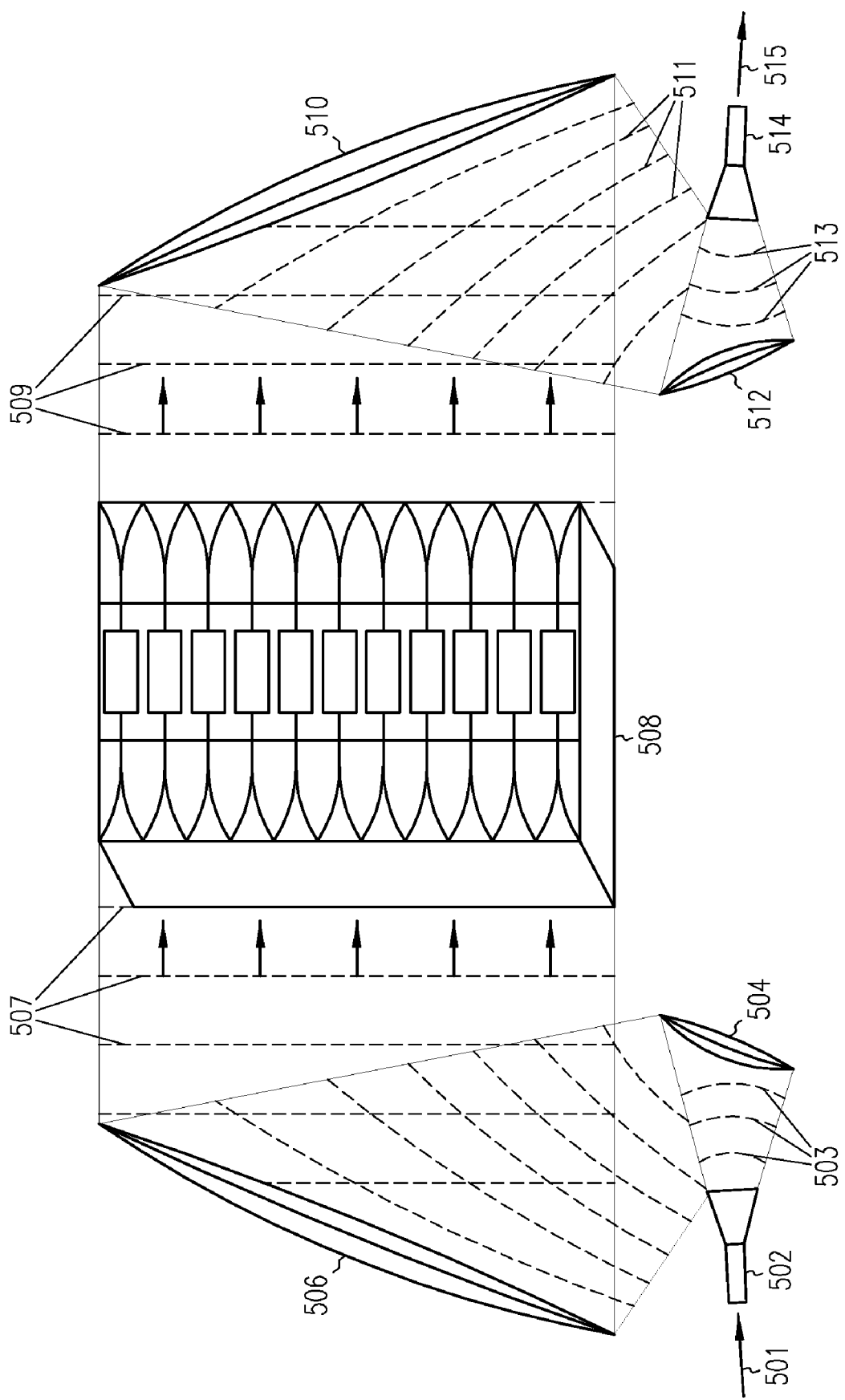
FIG. 5 illustrates a spatially-fed high-power amplifier for generating a high-power RF signal in accordance with some other embodiments of the present invention.
Figure 6:
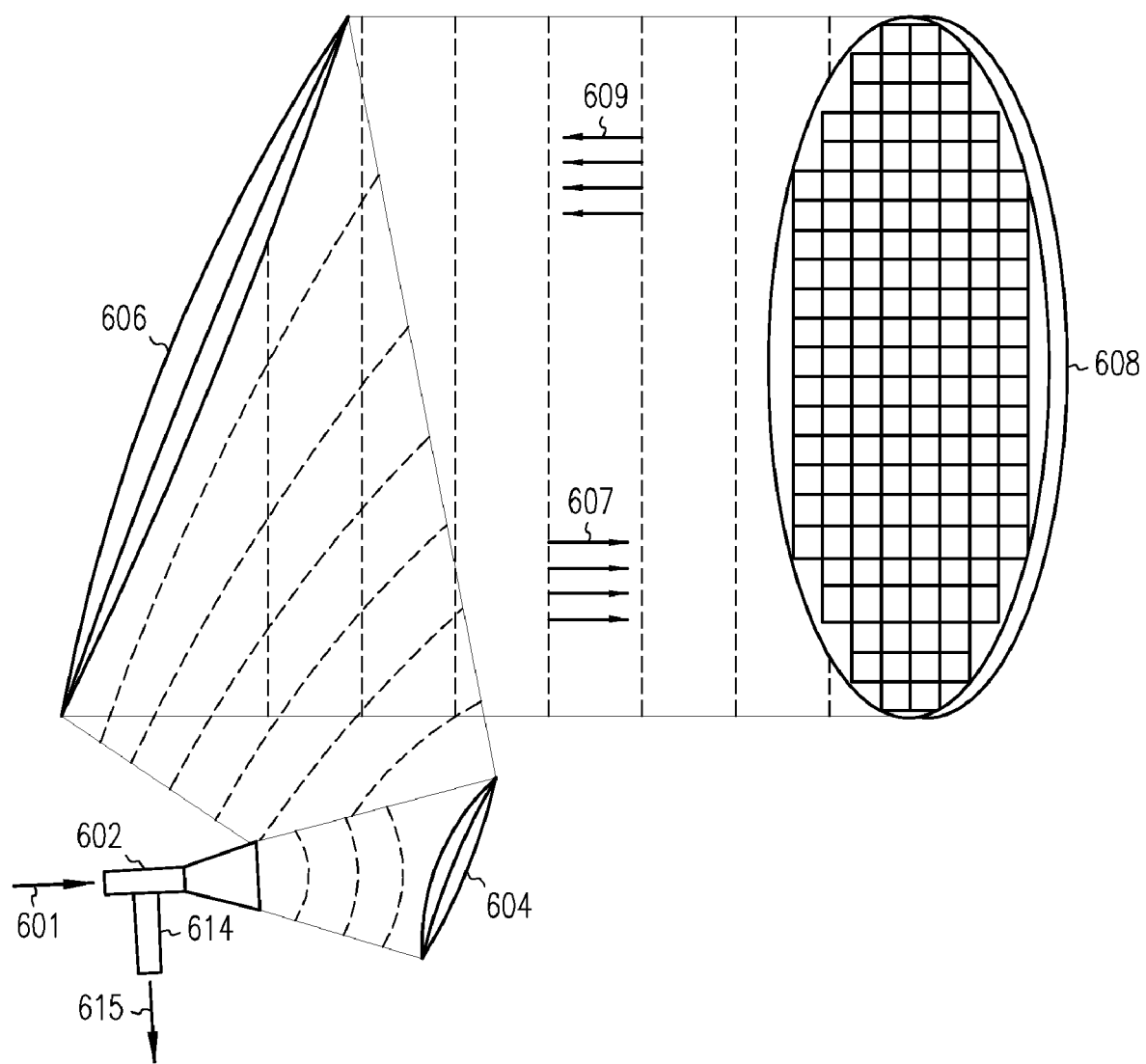
FIG. 6 illustrates a spatially-fed high-power amplifier for generating a high-power RF signal in accordance with yet some other embodiments of the present invention.

The spatially-fed amplifiers illustrated in FIGS. 1 and 3 radiate the amplified energy (i.e., in the air), however in some situations, the high-power may need to be utilized in a fashion that is not radiated. For example, it may need to be contained in a waveguide of other type of transmission medium. Examples of some other embodiments of the present invention that provide high-power energy in a waveguide medium are illustrated in FIGS. 4-6 described below.

Figure 4:
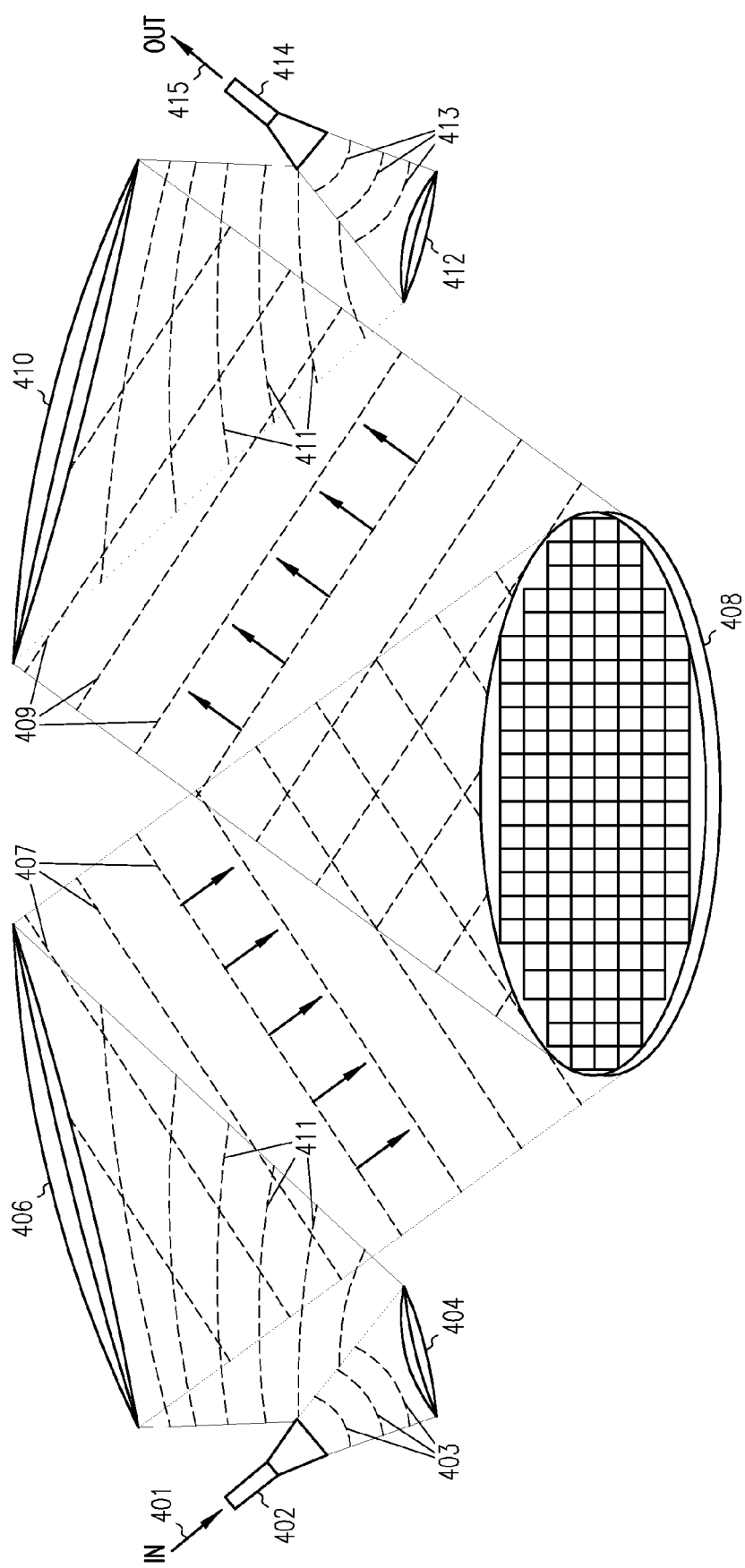
FIG. 4 illustrates a spatially-fed high-power amplifier for generating a high-power RF signal in accordance with some embodiments of the present invention.

FIG. 4 illustrates a spatially-fed high-power amplifier for generating a high-power RF signal in accordance with some embodiments of the present invention. Spatially-fed high-power amplifier 400 comprises feed horn 402 to generate initial wavefront 403 from low-power RF input signal 401, reflectors 404 and 406 having RF reflective surfaces to reflect initial wavefront 403 and generate reflected wavefront 407, and active reflect array amplifier 408 to amplify reflected wavefront 407 to generate high-power planar wavefront 409.

In these embodiments, spatially-fed high-power amplifier 400 also comprises reflectors 410 and 412 having RF reflective surfaces positioned to reflect high-power planar wavefront 409 and generate substantially spherical output wavefront 413. In some embodiments, wavefront 409 may be collimated. In these embodiments, spatially-fed high-power amplifier 400 also comprises output feed-horn 414 to receive substantially spherical output wavefront 413 and generate high-power RF output signal 415. In some embodiments, output feed-horn 414 may be a horn antenna and high-power RF output signal 415 may be provided within an output waveguide, although the scope of the invention is not limited in this respect.

In some embodiments, reflector 410 may comprise a section of a modified paraboloid surface and reflector 412 may comprises a section of a modified hyperboloid surface, although the scope of the invention is not limited in this respect. Reflective surfaces of the RF reflectors 404 and 406 may be selected so that reflected wavefront 407 is substantially uniform in amplitude when incident on active reflect array amplifier 408.

FIG. 5 illustrates a spatially-fed high-power amplifier for generating a high-power RF signal in accordance with some other embodiments of the present invention. Spatially-fed high-power amplifier 500 comprises feed horn 502 to generate initial wavefront 503 from low-power RF input signal 501, reflectors 504 and 506 having RF reflective surfaces to reflect initial wavefront 503 and generate reflected wavefront 507, and active lens array amplifier 508 to amplify reflected wavefront 507 to generate high-power planar wavefront 509.

In these embodiments, spatially-fed high-power amplifier 500 also comprises reflectors 510 and 512 having RF reflective surfaces positioned to reflect high-power planar wavefront 509 and generate substantially spherical output wavefront 513. In some embodiments, wavefront 509 may be collimated. In these embodiments, spatially-fed high-power amplifier 500 also comprises output feed-horn 514 to receive substantially spherical output wavefront 513 and generate high-power RF output signal 515. In some embodiments, output feed-horn 514 may be a horn antenna and high-power RF output signal 515 may be provided within an output waveguide, although the scope of the invention is not limited in this respect.

In some embodiments, reflector 510 may comprise a section of a modified paraboloid surface and reflector 512 may comprises a section of a modified hyperboloid surface, although the scope of the invention is not limited in this respect. Reflective surfaces of the RF reflectors 504 and 506 may be selected so that reflected wavefront 507 is substantially uniform in amplitude when incident on active lens array amplifier 508.

FIG. 6 illustrates a spatially-fed high-power amplifier for generating a high-power RF signal in accordance with yet some other embodiments of the present invention. Spatially-fed high-power amplifier 600 comprises feed horn 602 to generate initial wavefront 603 from low-power RF input signal 601, reflectors 604 and 606 having RF reflective surfaces to reflect initial wavefront 603 and generate reflected wavefront 607, and active reflect array amplifier 608 to amplify reflected wavefront 607 to generate reflected high-power planar wavefront 609. Reflective surfaces of the RF reflectors 604 and 606 may selected so that reflected wavefront 607 is substantially uniform in amplitude when incident on active reflect array amplifier 608. In these embodiments, array amplifier 608 may be positioned to generate the high-power planar wavefront 609 in a direction directly opposite to reflected wavefront 607 for reflection by reflectors 606 and 604 and for incidence on feed horn 602. In this way, reflectors 606 and 604 generate a high-power spherical wavefront incident on feed horn 602. Feed horn 602 may generate high-power RF output signal 615 from the high-power spherical wavefront incident on feed horn 602. In these embodiments, orthomode transducer 614 may be coupled with feed horn 602 to separate low-power RF input signal 601 from high-power RF output signal 615, although the scope of the invention is not limited in this respect. In these embodiments, orthomode transducer allows the horn to radiate a wavefront (the low-power input wavefront) of a first polarization (e.g., vertical) while simultaneously receiving a wavefront (the high-power output wavefront) of a second polarization (e.g., horizontal). Array amplifier 608 may use receive and transmit antennas of corresponding orthogonal polarizations to receive the low-power input wavefront and generate a reflected high-power output wavefront.

Figure 7:
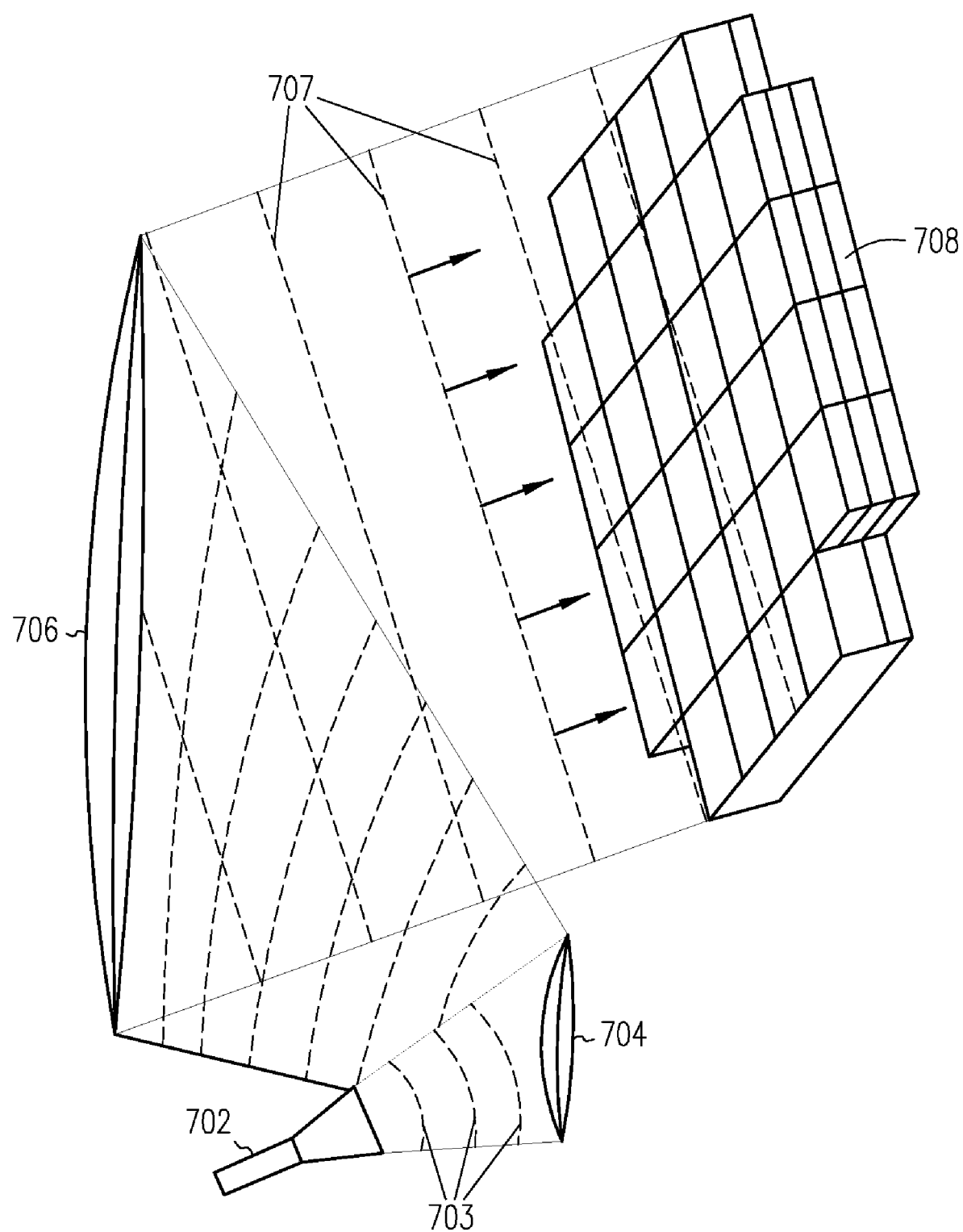
FIG. 7 illustrates the shaping of wavefronts by reflective surfaces in accordance with some embodiments of the present invention.

FIG. 7 illustrates the shaping of wavefronts by reflective surfaces in accordance with some embodiments of the present invention. One problem with spatially-fed arrays is the amount of energy that is spilled over the rim of the array. This problem is exacerbated when the rim of the array is a complex shape. Because most feed horns generate a circular or elliptical shaped beam, a lot of energy is wasted feeding an array amplifier that is not circular or elliptical. In accordance with some embodiments of the present invention, the illumination of the input wavefront may be tailored to the shape of the array amplifier. In FIG. 7, spherical wavefront 703 generated by feed horn 702 may be converted to substantially planar wavefront 707 with reflectors 704 and 706. In these embodiments, the amplitude components of the electric field of wavefront 707 may be tailored to the shape of amplifier array 708. In this example, the power may be concentrated within array 708 (i.e., with cut-out corners) and reduced outside the array, particularly at the corners, so as to reduce wasted energy.

Figure 8:
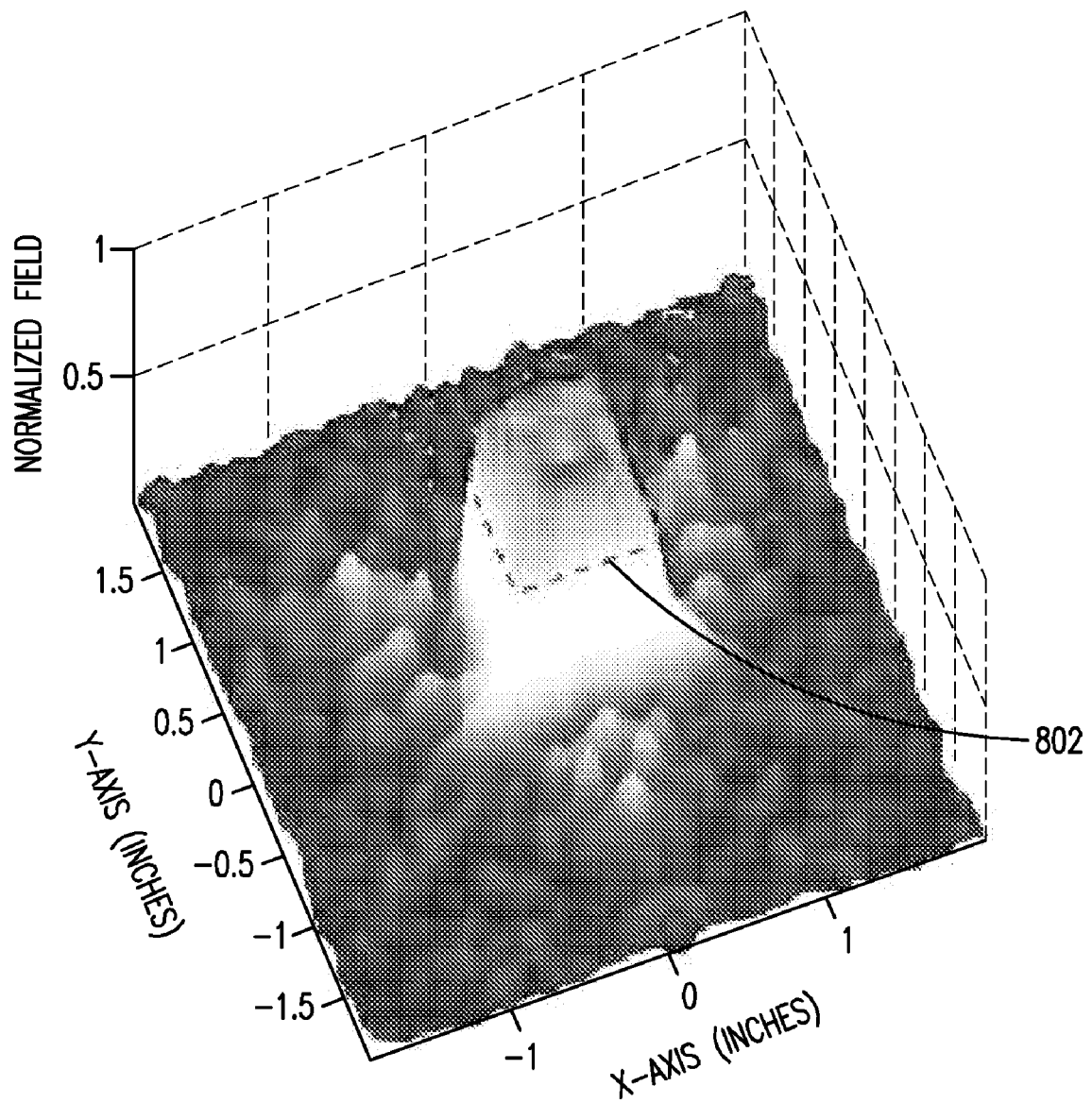
FIG. 8 illustrates a three-dimensional view of an example electric field illumination on an active array amplifier.

FIG. 8 illustrates a three-dimensional view of an example electric field illumination on an active array amplifier. In this example, outline 802 may represent a square amplifier array. As illustrated, the electric field within the region of the amplifier array is significantly greater than the electric field outside the amplifier array. As can be seen, the efficiency of a spatially fed amplifier may be significantly increased by concentrating the energy within the shape of the amplifier array. In these embodiments, shaped reflective surfaces may be selected to provide this result.

Figure 9:
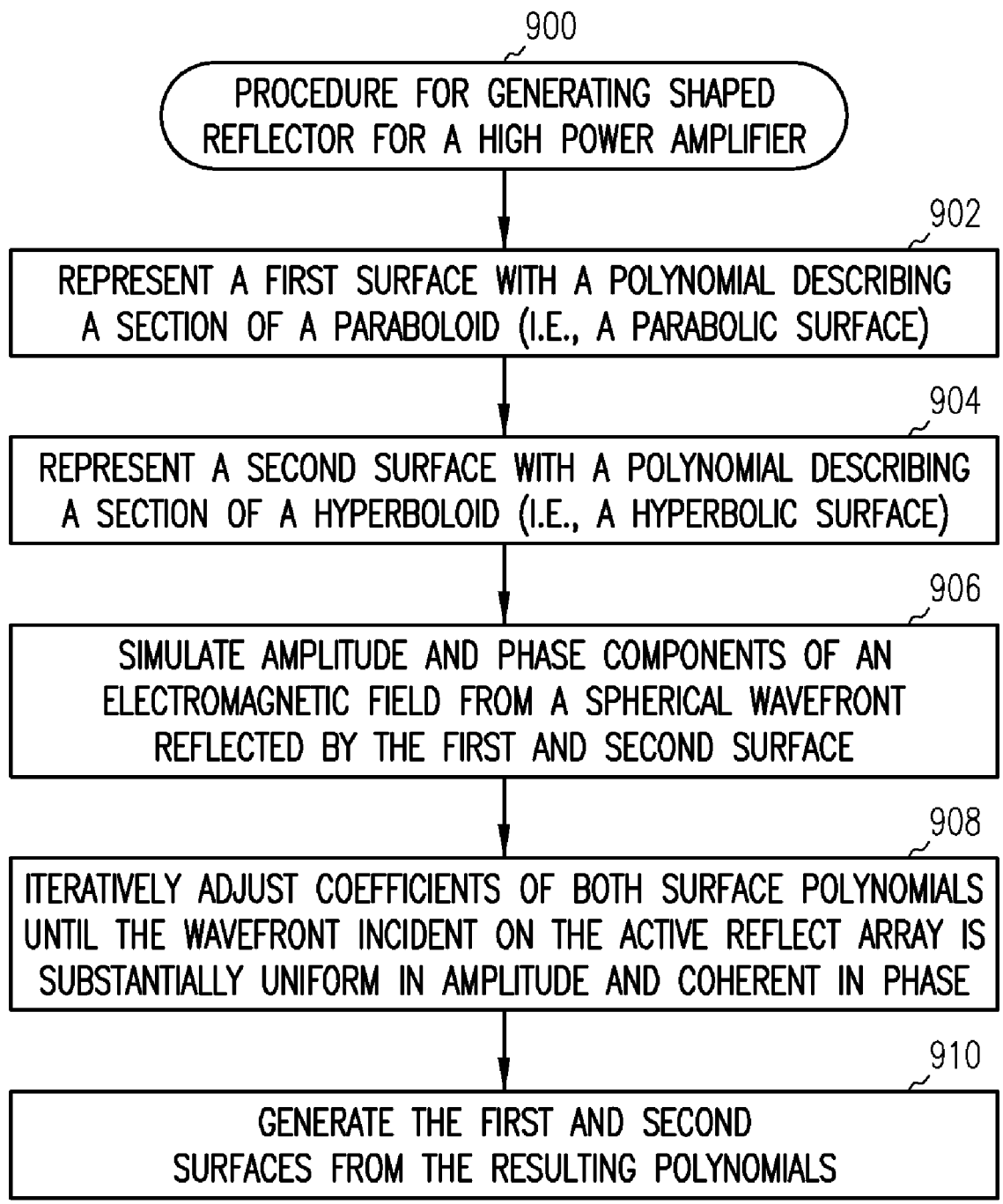
FIG. 9 is a flow chart of a procedure for generating shaped reflectors in accordance with some embodiments of the present invention.

FIG. 9 is a flow chart of a procedure for generating shaped reflectors in accordance with some embodiments of the present invention. Procedure 900 may be used to generate one or more shaped RF reflectors, such as reflectors 104 and 106 (FIGS. 1A and 1B), reflectors 304 and 306 (FIG. 3), reflectors 404, 406, 410 and 412 (FIG. 4), reflectors 504, 506, 510 and 512 (FIG. 5), reflectors 604 and 606 (FIG. 6) and reflectors 704 and 706 (FIG. 7).

In operation 902, a first surface, such as surface 104 (FIG. 1A) is represented by a first polynomial describing a section of the first surface. In operation 904, a second surface, such as surface 106 (FIG. 1A) is represented by a second polynomial describing a section of the second surface. The surfaces may, for example, be a paraboloid, hyperboloid or ellipsoid, although other three-dimensional surfaces may also be suitable.

In operation 906, amplitude and phase components of an incident wavefront reflected by the surfaces may be simulated based on the polynomials representing the surfaces. In some embodiments, the incident wavefront may be a spherical wavefront such as wavefront 103 (FIG. 1A).

In operation 908, the coefficients of the polynomials representing the surfaces may be iteratively adjusted until the reflected wavefront, such as wavefront 107 (FIG. 1A), is substantially uniform in amplitude and/or coherent in phase. In some embodiments, the coefficients may be adjusted to maximize a figure of merit to achieve a flat power density across the surface of the array antenna. In some embodiments, an optimization algorithm may be used.

In operation 910, reflective surfaces may be generated based on the polynomials resulting from operation 908. In some embodiments, operation 910 may comprise generating the reflective surfaces out of metal (i.e., with a computer controlled milling machine), although the scope of the invention is not limited in this respect.

In other embodiments, operation 910 comprises generating the reflective surfaces using a stereolithography process. In these embodiments, the stereolithography process may comprise generating three-dimensional computer models of the surfaces based on the polynomials and using an ultraviolet laser to selectively harden layers of a liquid polymer based on the computer model. In these embodiments, a three-dimensional model of the surface may be created in a CAD program. The computer software may "cut" the model into thin layers (e.g., five to ten layers per millimeter of thickness). An ultraviolet laser may "paint" one of the layers exposing the top surface of the liquid plastic (i.e., a photopolymer) in a tank and hardening it. The photopolymer may be sensitive to ultraviolet light so that wherever the laser touches it, the polymer hardens. The platform drops down into the tank a fraction of a millimeter, and then the laser "paints" the next layer on top of the previous layer. This process may be repeated layer by layer until the three-dimensional surface section is formed. The surface may be removed from the tank and rinsed with solvent to remove any uncured plastic. Each surface may then be cured in an ultraviolet oven to harden the plastic. The plastic surface may then be coated with an RF reflective coating such as a metallic paint or an electrolyses metallic plating, although the scope of the invention is not limited in this respect.

Although embodiments of the present invention are described as using an active array amplifier, the scope of the invention is not limited in this respect. In some embodiments, a passive array antenna, such as a flat aperture parabolic (FLAPs) antenna, may be fed with shaped reflectors or shaped lenses as described herein.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features may be occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, invention may lie in less than all features of a single disclosed embodiment. Thus the following claims are hereby incorporated into the detailed description, with each claim standing on its own as a separate preferred embodiment.

What is claimed is:

1. A spatially-fed high-power amplifier comprising:
   one or more curved reflectors having an associated one or more radio-frequency (RF) reflective surfaces having curvatures configured to reflect an initial wavefront and generate a reflected wavefront; and
   a spatially-fed active array amplifier comprising a plurality of amplifier cells configured to amplify the reflected wavefront to generate a high-power planar wavefront, the curvatures of the one or more reflective surfaces to at least in part compensate for an amplitude taper of the initial wavefront and provide the reflected wavefront with substantially uniform amplitude when incident on the spatially-fed active array amplifier,
   wherein an RF source generates the initial wavefront having the amplitude taper, and
   wherein the amplifier cells have their gain set to cumulatively offset remaining tapered amplitude components of the reflected wavefront to generate the high-power planar wavefront with uniform amplitude components.

2. The amplifier of claim 1 wherein the initial wavefront comprises a substantially spherical wavefront, and
   wherein the reflective surfaces comprise reflective material selected to reflect substantially all energy comprising the initial wavefront.

3. The amplifier of claim 2 wherein the RF reflectors comprise at least one of a section of a modified paraboloid surface, a section of a modified hyperboloid surface, or a section of a modified ellipsoid surface, and
   wherein the curvatures of the reflective surfaces are represented by polynomials having coefficients selected to at least in part compensate for the amplitude taper to provide the reflected wavefront incident on the active array amplifier substantially uniform in amplitude.

4. The amplifier of claim 2 wherein the RF reflectors comprise a first reflector and a second reflector, the first reflector comprising a section of a modified paraboloid surface, the second reflector comprising a section of a modified hyperboloid surface, and
   wherein the spatially-fed active array amplifier includes automatic gain control to operate each amplifier cell at or near saturation when the gain is set to further offset remaining tapered amplitude components of the reflected wavefront.

5. The amplifier of claim 4 wherein the spatially-fed active array amplifier is a spatially-fed active reflect array amplifier comprising a plurality of amplifier cells and having a plurality of orthogonally polarized receive and transmit antennas on a same side of a planar surface to generate the high-power planar wavefront in a reflected direction,
   wherein the receive antennas are configured to receive the reflected wavefront and provided the received reflected wavefront to a plurality of amplifier cells and the transmit antennas are configured to transmit signals amplified by the plurality of amplifier cells to provide the high-power planar wavefront.

6. The amplifier of claim 1 wherein the active array amplifier comprises a plurality of substantially identical amplifier cells, each amplifier cell having a receive antenna configured to receive the reflected wavefront, a power amplifier configured to amplify RF signals received through the receive antenna, and a transmit antenna configured to transmit the amplified RF signals provided by the power amplifier,
   wherein the amplified RF signals transmitted by the plurality of amplifier cells comprise a planar output collimated wavefront.

7. The amplifier of claim 3 wherein the reflective surfaces comprise three-dimensional (3D) plastic surfaces having RF reflective coating disposed thereon.

8. A spatially-fed millimeter-wave amplifier comprising:
   a first shaped reflector comprising a section of a modified paraboloid surface;
   a second shaped reflector comprising a section of a modified hyperboloid surface, the reflectors having curvatures configured to reflect a substantially spherical initial wavefront and generate a reflected wavefront; and
   a spatially-fed active array amplifier comprising a plurality of amplifier cells configured to amplify the reflected wavefront to generate a high-power planar wavefront,
   wherein the curvatures of the reflective surfaces are selected to at least in part compensate for an amplitude taper of the initial wavefront and are selected to provide the reflected wavefront with substantially uniform amplitude components when incident on the active array amplifier, and
   wherein an RF source generates the substantially spherical initial wavefront having the amplitude taper, and
   wherein the amplifier cells have their gain set to further offset remaining tapered amplitude components of the reflected wavefront to generate the high-power planar wavefront with uniform amplitude components.

9. The spatially-fed millimeter-wave amplifier of claim 8 wherein reflective surfaces of the reflectors are represented by polynomials having coefficients selected to provide the reflected wavefront to be incident on the spatially-fed active array amplifier substantially uniform in amplitude.

10. The spatially-fed millimeter-wave amplifier of claim 9 wherein the reflective surfaces comprise three-dimensional (3D) plastic surfaces having RF reflective coating disposed thereon.

11. The spatially-fed millimeter-wave amplifier of claim 10 wherein the spatially-fed active array amplifier comprises a plurality of substantially identical amplifier cells, each amplifier cell having a receive antenna configured to receive the reflected wavefront, a power amplifier configured to amplify RF signals received through the receive antenna, and a transmit antenna configured to transmit the amplified RF signals provided by the power amplifier, and
   wherein the amplified RF signals transmitted by the plurality of amplifier cells comprise a planar output collimated wavefront, and
   wherein the spatially-fed active array amplifier includes automatic gain control to operate each amplifier cell at or near saturation when the gain is set to further offset remaining tapered amplitude components of the reflected wavefront.

* * * * *

UNITED STATES PATENT AND TRADEMARK OFFICE
CERTIFICATE OF CORRECTION

PATENT NO. : 7,715,091 B2  Page 1 of 1
APPLICATION NO. : 12/194319
DATED : May 11, 2010
INVENTOR(S) : Kenneth W. Brown It is certified that error appears in the above-identified patent and that said Letters Patent is hereby corrected as shown below:

On the title page, item (54), in "Title", in column 1, line 1, delete "HIGH POWER" and insert -- HIGH-POWER --, therefor.

On the title page, item (75), in "Inventors", in column 1, line 1, delete "Tucson, AZ" and insert -- Yucaipa, CA --, therefor.

In column 1, line 1, delete "HIGH POWER" and insert -- HIGH-POWER --, therefor.

Signed and Sealed this

Twenty-ninth Day of June, 2010

David J. Kappos
*Director of the United States Patent and Trademark Office*